United States Patent

[11] 3,588,633

[72] Inventor John H. Hayden
Milpitas, Calif.
[21] Appl. No. 846,636
[22] Filed July 16, 1969
[45] Patented June 28, 1971
[73] Assignee Signetics Corporation
Sunnyvale, Calif.
Continuation of application Ser. No. 504,748, Oct. 24, 1965, now abandoned.

[54] SEMICONDUCTOR STRUCTURE HAVING CONTROLLED BORON IMPURITY DIFFUSION PROFILE
4 Claims, 32 Drawing Figs.

[52] U.S. Cl. .......... 317/234, 317/235, 29/576

[51] Int. Cl. .......... H01l 7/02, H01l 5/00

[50] Field of Search .......... 317/234/3.1, 234/3, 235

[56] References Cited

UNITED STATES PATENTS 3,399,331 8/1968 Mutter .......... 317/234

*Primary Examiner*—James D. Kallam
*Attorney*—Flehr, Hohbach, Test, Albritton & Herbert ABSTRACT: Semiconductor structure with a boron impurity profile in a region so that the concentration of the boron at the surface is substantially at least equal to the concentration at any other depths in the region.

INVENTOR.
John H. Hayden
BY Flehr and Swain
Attorneys

INVENTOR.
John H. Hayden
BY Flehr & Swain
Attorneys

Uniform Distribution | Linear Distribution | Gaussian or Error Function Distribution | Expodential Distribution

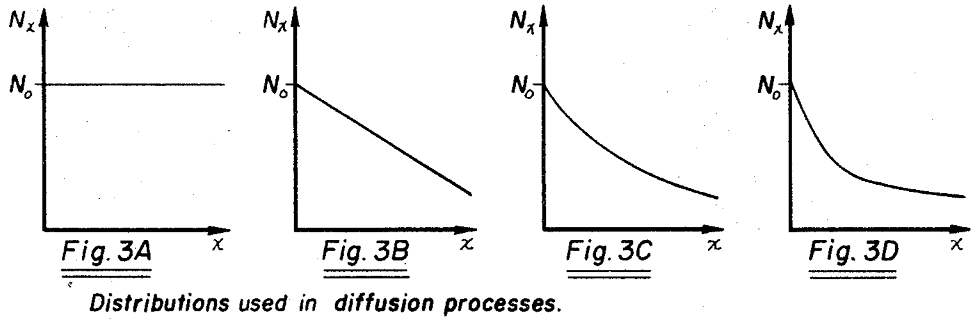

Fig. 3A, Fig. 3B, Fig. 3C, Fig. 3D

Distributions used in diffusion processes.

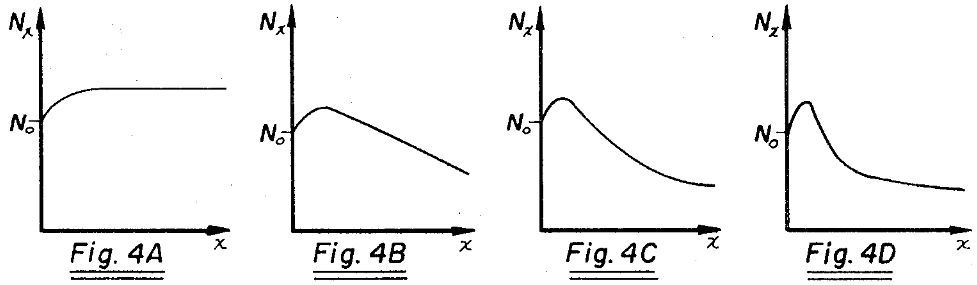

Fig. 4A, Fig. 4B, Fig. 4C, Fig. 4D

Distributions after diffusion processes without the glass method.

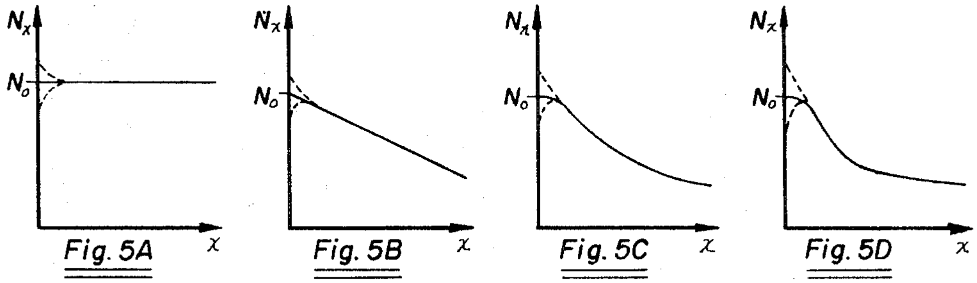

Fig. 5A, Fig. 5B, Fig. 5C, Fig. 5D

Distributions after diffusion processes with the glass method.

Note: Solid line is typical distribution & dotted lines give range of possible distributions.

$x$ — Distance from surface.

$N_o$ — Impurity concentration at the surface.

$N_x$ — Impurity concentration at x

INVENTOR.
John H. Hayden
BY Fleher & Swain
Attorneys

Oxidation Rate of a Semiconductor Material

Current-gain-bandwidth Frequency ($f_T$) with and without the Glass Method.

$x_o$ — semiconductor surface
$x_{eb}$ — emitter-base junction
$x_{bc}$ — base-collector junction
$x_{es}$ — epi substrate junction INVENTOR
John H. Hayden
BY Flehr and Swain
Attorneys

SEMICONDUCTOR STRUCTURE HAVING CONTROLLED BORON IMPURITY DIFFUSION PROFILE

This application is a continuation of Ser. No. 504,748, now abandoned.

This invention relates to a semiconductor structure having a controlled boron diffusion profile.

Heretofore it has been found that in the manufacture of semiconductor devices and structures utilizing a boron diffusion step, a depletion of boron or, in other words, a lowering of the boron concentration, has occurred at the interface between the silicon dioxide and the silicon of the semiconductor devices. Although the reasons for this phenomena are not completely known, it is believed that this depletion of boron is caused by the fact that the boron is "gettered" by the oxide growth, that is, during the oxide growth, the boron at the silicon-silicon oxide interface is redistributed with the larger portion of boron being incorporated in the oxide. Thus, the surface of the silicon immediately adjacent the silicon dioxide layer is at least partially depleted of boron. This boron depletion region may unfavorably affect certain characteristics or parameters a semiconductor device. For example, it has been found that the high frequency response of a transistor is often limited by the formation of the boron depletion region. There is, therefore, a need for a new and improved semiconductor structure and a method for diffusing boron which eliminates or minimizes the formation of such depletion regions, that are inherent in standard state-of-the-art technology. The need is particularly important in planar technology in which there is an oxide formed during one diffusion step to act as (1) a mask for a subsequent diffusion step, (2) an insulator from subsequent overlaid metal, or (3 ) a passivation mask from environmental ambients.

In general, it is an object of the present invention to provide a semiconductor structure having a controlled boron diffusion profile.

Another object of the invention is to provide a semiconductor structure of the above character which has a high boron concentration at the surface of the silicon adjacent the thermally grown silicon dioxide.

Another object of the invention is to provide a semiconductor structure of the above character in which greatly improved P-type impurity profiles can be obtained in planar passivated semiconductor devices.

Another object of the invention is to provide a semiconductor structure of the above character which is applicable to all types of diffused devices utilizing P-type impurities as, for example, resistors, crossovers, capacitors, diodes, NPN and PNP transistors and integrated monolithic circuits.

Additional objects and features of the invention will appear from the following description in which the preferred embodiments are set forth in detail in conjunction with the accompanying drawings.

Referring to the drawings:

FIGS. 1A—1J are cross-sectional views of semiconductor structures showing the principal steps for fabricating an NPN transistor incorporating the present invention.

FIGS. 2A—2G are cross-sectional view of semiconductor structures showing the principal steps for manufacturing a transistor of the PNP-type incorporating the present invention.

FIGS. 3A, 3B, 3C and 3D are graphs showing P-type impurity profiles for uniform, linear, Gaussian or error function and exponential distributions used in conventional diffusion processes.

FIGS. 4A, 4B, 4C and 4D are graphs showing P-type impurity profiles with distributions of the type shown in FIGS. 3A—3D after a conventional diffusion process.

FIGS. 5A, 5B, 5C and 5D are P-type impurity profiles similar to those shown in FIGS. 4A—4D but showing the distributions after utilizing a diffusion process incorporating the present invention.

In general, the method for controlling the P-type impurity diffusion profile in the manufacture of a semiconductor structure consists of utilizing a layer of low temperature glass to inhibit the rate of formation of thermally grown silicon dioxide during subsequent semiconductor processes that cause solid state diffusion to occur. The inhibition of the silicon dioxide formed during high temperature diffusion processes greatly reduces the "gettering" of the P-type impurity (i.e., boron) from the semiconductor surface contacting the thermally grown silicon dioxide. A semiconductor structure fabricated utilizing such a method has been found to have a concentration of boron at the surface of the P-type region that is substantially at least as great as the concentration at any other depth in the p-type region and to give greatly improved characteristics as, for example, an improved, high frequency response.

Figures 1A, 1B, 1C, 1D, 1E, 1F, 1G, 1H, 1I, 1J:
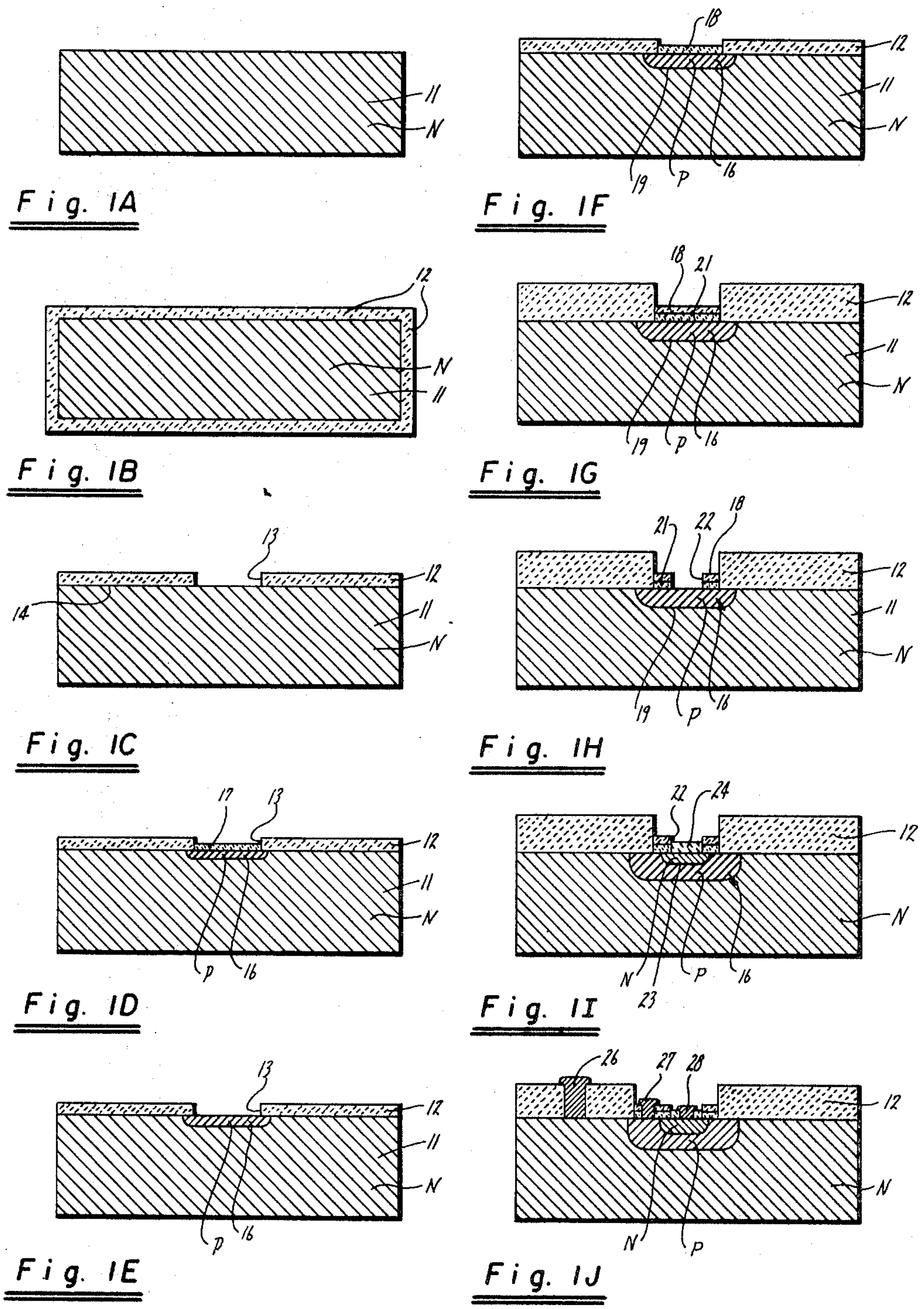

The method for manufacturing a semiconductor device having a controlled boron diffusion profile incorporating the present invention is shown in FIGS. 1A—1J, although the principal features of the invention are shown in FIGS. 1F and 1G. The method represented by these FIGS. is particularly adaptable for manufacturing an NPN transistor. As shown in FIG. 1A, the semiconductor structure is formed by first taking a semiconductor body 11 of a suitable type, such as a slice or wafer of single crystal or monocrystalline silicon, which also may be of either N- or P-type conductivity. However, assuming that it is desired to construct an NPN-type device, it is desirable that the body 11 by of N-type conductivity as shown in FIG. 1A.

A layer 12 of suitable insulating material is formed on the body 11 so that it encloses the body as shown in FIG. 1B. By way of example, a layer of silicon dioxide can be thermally grown on the body 11 by placing the body 11 in an atmosphere of oxygen and heating the semiconductor body to a relatively high temperature as, for example, 1,000°—1,300° C. for a period of time which can vary from approximately one-half hour to as much as 10 hours depending upon the thickness of the insulating layer desired.

A hole or opening 13 is formed in the layer 12 to expose the surface of the body through the hole by conventional photolithographic techniques. With such techniques, a photoresist is applied to the layer 12 and is then exposed to a light source which sensitizes the photoresist. Portions of the photoresist are removed, and thereafter a suitable etch, such as a dilute solution of hydrofluoric acid, is applied to the semiconductor structure which will remove the expose silicon dioxide to give a structure as shown in FIG. 1C, with the semiconductor surface 14 exposed as shown.

Thereafter, as shown in FIG. 1D, a P-type impurity, i.e., boron, predeposition step is carried out. This again is done in a conventional manner such as by passing boron tribromide vapor into the furnace carrying the semiconductor structure while maintaining the furnace at a temperature between 1,000° and 1,300° C. for a period of time from 5 to 15 minutes. As shown in FIG. 1D, during this predeposition step, a very shallow diffused region 16 is formed immediately below the portion of the surface 14 of the body 11 exposed through the hole 13. At the same time, a very shallow layer 17 of silicon dioxide is also being formed. This silicon dioxide layer 17, which is being formed during this predeposition step, is also heavily doped with boron from the boron tribromate vapor. As soon as the predeposition step has been carried out, the silicon dioxide layer 17 is usually stripped off, as shown in FIG. 1E, either by conventional photolithographic techniques of the type described above or alternatively by the entire structure being dipped into a solution of hydrofluoric acid, which in addition to removing the layer 17, will also remove a small portion of the remaining silicon dioxide layer 12 which is not objectionable.

As soon as the thermally grown layer 17 of silicon dioxide has been removed, it is replaced by a layer 18 of low-temperature glass as shown in FIG. 1F. Low-temperature glass as used in this specification is defined as any nonsemiconductor dielectric which can be deposited on a semiconductor body without raising the temperature of the semiconductor body to significantly redistribute the N-type or P-type impurities in the semiconductor body or to form significant silicon dioxide on the body. The low-temperature glass can be grown by low-temperature passivation techniques at temperatures which are normally below 400°—900° C. The low-temperature glass also should be dense enough so that environmental contaminants cannot get through it to the surface below. One technique hereinafter described in detail is the use of anodic oxidation to grow a layer of silicon dioxide. Other suitable techniques would be the use of vapor deposition to deposite boron-aluminum-silicate glasses, the use of epitaxial techniques to form epitaxial reaction glasses and the use of thermal techniques to thermally decompose organic silicates.

By way of illustration, anodic oxidation is used to form the layer 18 shown in FIG. 1F, but for simplicity only one method is illustrated. The anodization or electrochemical deposition can be carried out by immersing the structure shown in FIG. 1E, which has been already installed in as appropriate electrode assembly, in a suitable electrolyte such as freshly prepared ethylene glycol-$KNO_3$ solution at a temperature of 25°—° C. Anodization can be carried out at a constant current with current densities ranging from 1 to 25 milliamperes per centimeter squared. The anodization is terminated when the predetermined forming voltage is reached. The forming voltage is the difference between the finite voltage attained and the initial starting voltage between the silicon anode and the platinum cathode of the electrode assembly and is directly dependent upon the oxide thickness formed.

By way of example, in practicing the present invention, constant currents ranging from 5 to 15 milliamperes per centimeter squared were utilized in an anodizing solution consisting of 0.04 normal potassium nitrate and ethylene glycol. A forming voltage of 300 volts was utilized which corresponds to 800-—1,650 angstroms of silicon dioxide ±50 angstroms. The time required for forming the silicon dioxide layer 18 electrochemically varied depending upon the current density utilized. Thus, at lower current densities, approximately 10 to 20 minutes were required, whereas at higher current densities, a proportionally shorter time as, for example, 5 minutes, were required. It appears that the formation of the layer 18 is best at a current density of approximately 10 milliamperes per centimeter squared requiring approximately 15 minutes in anodization time.

After the anodization step has been completed, the entire wafer is exposed to an elevated temperature in a diffusion furnace, the temperature ranging from 1,000° to 1,300° C. At these high elevated temperatures, a front of boron impurities is moved down into the silicon body 11 to greatly increase the size of the region 16 as shown in FIG. 1G and to expand the junction area 19 between the region 16 and the body 11 which extends to the surface 14. The body 11 of the N-type material conventionally forms the collector region of the transistor, whereas the boron-doped region 16 forms the base region of the transistor. At the same time that the front of boron impurities is moving down into the body 11, a layer 21 of thermally grown silicon dioxide is being formed on the surface 14 beneath the layer 18 of anodically grown silicon dioxide. The depth of this thermally grown layer 21 is, of course, determined by the length of time the wafer is in the diffusion furnace. However, layer 21 grows much more slowly than would be the case if the layer 18 was absent. This is because the anodically grown oxide layer 18 substantially impedes or inhibits the passage of oxygen to the surface 14 which is required for the formation of the silicon dioxide layer.

After the diffusion step required by FIG. 1G has been carried out, a hole 22 as shown in 1H formed in the anodically grown and thermally grown silicon dioxide layers 18 and 21 by conventional photolithographic techniques to expose the surface 14 within the region 16. Thereafter, in a conventional manner, as 1I illustrates, an N-type material, such as phosphorus enters through the opening 22 and thereafter diffuses into the region 16 to form an N-type region 23 in a portion of the previous P-type region 16 to form the junction 24 which extends to the surface 14. Region 23 provides the emitter for the transistor. During this diffusion step, another thermally grown silicon dioxide layer 24 is formed in the hole 22 as shown in FIG. 1I.

As soon as the diffusion step represented by FIG. 1I has been carried out, a plurality of openings are formed in the silicon dioxide layer 12, the anodically grown silicon dioxide layer 18, the thermally grown silicon dioxide layer 21 and the thermally grown silicon dioxide layer 24; and thereafter contact elements 26, 27 and 28 formed of a suitable material such as aluminum are evaporated into the holes to form contacts with the collector, base and emitter regions of the semiconductor structure as shown in FIG. 1J to form an NPN transistor.

It should be appreciated that the same procedure or method can be utilized in integrated circuitry. However, in integrated circuitry, it is conventional to start with a P-type substrate in which the N-type collector region is grown epitaxially on top of the P-type substrate. Thereafter, the steps illustrated in FIGS. 1A—1J can be carried out in the same manner on the epitaxially grown N-type collector region as on body 11. There is, however, an additional step of isolating the different collectors of the active elements, i.e., the transistors, from each other. This is normally accomplished by growing a silicon dioxide layer completely around the outside of the PN-type substrate with the epitaxially grown collector region thereon. Thereafter, windows are formed in the silicon dioxide by conventional photolithographic techniques and then a P-type impurity is diffused through these windows and through the N-type collector region down to the P-type substrate. Thereafter, the steps set forth in FIGS. 1A—1J can be carried out as hereinbefore described to provide the required devices for the integrated circuit.

It should also be appreciated that the method shown in FIGS. 1A—1J can also be carried out where it is desired to utilize a triple diffusion technique. Utilizing triple diffusion, it is possible to start out with a P-type material and to diffuse the N-collector into the P-type material utilizing conventional techniques. Thereafter, the steps shown in FIGS. 1A—1J can be carried out as hereinbefore described. Alternatively, the triple diffusion process in which an N-type substrate material of collector resistivity is used and the P-type isolation is diffused into both sides of the substrate at once until they meet to give the desired localized and isolated N-type regions. Thereafter, the steps shown in FIGS. 1A—1J can be carried out as hereinbefore described.

Figure 2A:
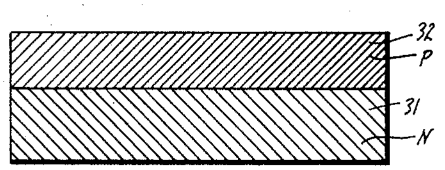
Figure 2E:
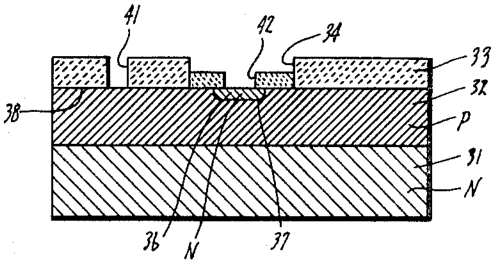
Figure 2B:
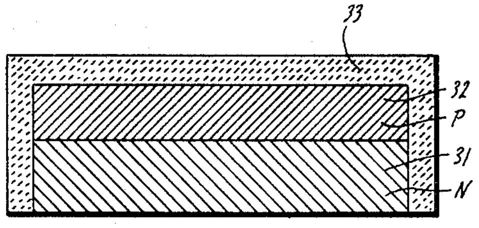

The method hereinbefore described is equally applicable to the construction of PNP transistors as shown in FIGS. 2A-—2G, in which the principal features are shown in FIG. 2A. As shown therein, the process is started by utilizing a semiconductor body or substrate 31 which can be either of the P-type or N-type depending upon whether it is to be used for integrated circuit fabrication or for strictly transistor fabrication. Assuming that it is to be utilized for transistor fabrication only, and isolation is not required, an N-type substrate can be utilized as shown in FIG. 2A. The P-type layer or body 32 is grown onto the body 31 by conventional epitaxial techniques or is diffused into the body 31 by conventional diffusion techniques. Thereafter, a layer 33 of silicon dioxide is anodically grown on top of the P-type body 32 and which also extends down the sides of the bodies 31 and 32 by a process substantially identical to that hereinbefore described in connection with FIG. 1F, and as shown in FIG. 2B.

Figure 2F:
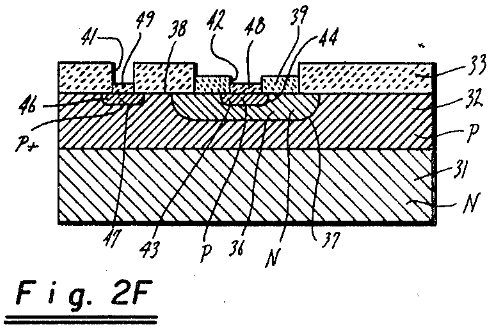
Figure 2C:
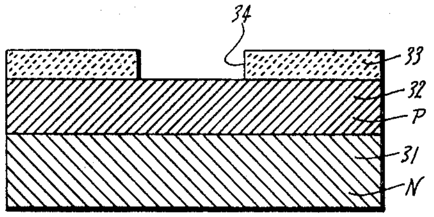

As soon the anodically grown silicon dioxide layer has been formed, an opening 34 is etched into the layer 33 by conventional photolithographic techniques as shown in FIG. 2C. The entire wafer is then placed in a diffusion furnace and the N-type base region 36 is diffused into the P-collector region 32 utilizing a suitable P-type dopant such as phosphorus to form a junction 37 between the regions 36 and 32 which extends to the semiconductor surface 38 of the body 32 as shown in FIG. 2D. During the time that this diffusion step is being carried out, a thermally grown layer 39 of silicon dioxide is also being formed. Thereafter, by conventional photolithographic techniques, an opening 41 is formed in the anodically grown silicon dioxide layer 33 and an opening 42 is formed in the thermally grown silicon dioxide layer 39 to expose the P-type collector region 32 and the N-type base region 36 as FIG. 2E shows.

The emitter diffusion step is next carried out as illustrated in FIG. 2F using a suitable source as boron tribromide in the manner hereinbefore described in a diffusion furnace to cause the emitter region 43 to be formed within the base region to provide a junction 44 which extends to the surface 38. At the same time, a P+ region 46 is formed below the opening 41 in the P-type region 32 to also form a junction 47 which extends to the surface 38. Layers 48 and 49 of thermally grown silicon dioxide are formed during this diffusion step.

If desired, the emitter diffusion can be carried out in two steps, particularly when a high resistivity or low concentration emitter is desired. In such a two-step emitter process, the boron is diffused in a predeposition step of the type hereinbefore described in conjunction with FIG. 1F. Thereafter, the predeposition thermally grown oxide is stripped off in a conventional manner such as by bathing the wafer in a dilute solution of hydrofluoric acid. Here the glass method may be employed if desired. Thereafter, the emitter is diffused to the desired depth in a diffusion furnace to obtain an emitter of the desired characteristics.

Figure 2G:
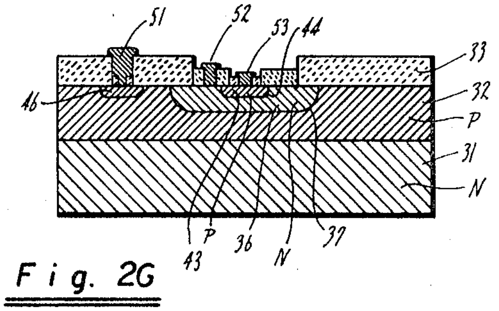
Figure 2D:
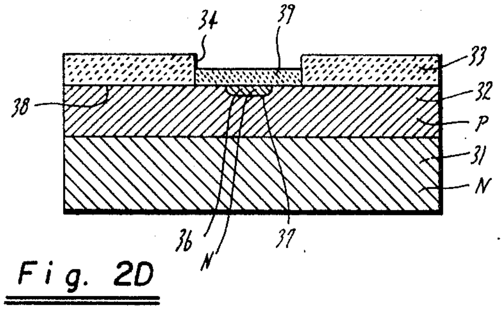

After either type emitter process has been completed, openings are formed in the silicon dioxide layer 49, the silicon dioxide layer 39 and the silicon dioxide layer 48 and contact elements 51, 52 and 53 are formed in a conventional manner such as by evaporating aluminum into the openings to make contact with the collector, base and emitter regions, respectively, of the PNP transistor as shown in FIG. 2G.

By utilizing the method or process hereinbefore described in the fabrication or manufacture of NPN or PNP transistors and other types of diffused devices such as resistors, crossovers, capacitors, diodes, MOS field effect transistors, and integrated monolithic circuits, it has been found that it is possible to obtain greatly improved P-type impurity profiles.

In FIGS. 3A—3D, 4A—4D and 5A—5B, there are shown basic distributions for P-type impurity profiles. However, in reality, there are five different distributions but the Gaussian and error function distributions are very similar, and for that reason have been included in one FIG. FIGS. 3A—3D show the distributions of the P-type impurity profiles prior to the diffusion process. FIG. 4A—4D show the distribution of the P-type impurity profiles utilizing conventional diffusion processes; in other words, not utilizing the anodically grown layer of silicon dioxide which also can be called a "low-temperature glass." "Low-temperature glass" is defined as the glass formed at any temperature (normally room temperature) from below zero up to approximately 900° C. where oxidation rates are still low. FIGS. 5A—5D show the P-type impurity profile distribution after diffusion utilizing the present invention, i.e., utilizing the low-temperature glass. The solid line represents the typical distribution, whereas the dotted lines give the upper and lower ranges which are possible.

In the graphs shown in FIGS. 3A—D, 4A—D and 5A—D, the distance from the semiconductor surface is the abscissa and is represented by $x$, whereas the ordinate represents the number of impurity atoms per cubic centimeter and is represents by the designation $N_x$. The designation $N_0$ represents the impurity concentration at the surface where $x$ equals zero. From FIGS. 4A—D, it can be seen that with the conventional diffusion process, the impurity concentration at the surface for any of the distributions shown drops off very sharply to give an undesired P-type impurity profile for certain applications. As is well known to those skilled in the art, such a P-type impurity profile is undesirable particularly where certain parameters of the device are involved. For example, it may have an undesirable effect on the sheet resistance, that is, the ohms per square. It is also undesirable in high frequency transistors in which it is desired to have a high emitter injection frequency in which the electrons are carried across the base or the minority carriers are carried across the base region and collected in the collector. Any recombination or any loss of minority carriers in the base is considered leakage. With a base impurity profile of the P-type impurities, there is a retarding field which is caused by a depletion of the P-type impurities immediately beneath the surface of the device. This effect is particularly significant where a relatively shallow emitter is utilized as in the case of high frequency transistors.

As can be seen from the impurity profiles in FIGS. 5A—D, this depletion of the P-type impurities immediately adjacent the surface can be avoided and can, if desired, be actually increased so that it greater than the concentration at any other depth in the region. However, it is generally sufficient merely to eliminate the depletion region or, in other words, to zero out the effect which was previously created by the depletion region. However, a greater concentration of impurities at the surface, represented by the upper dotted lines in FIGS. 4A—D, gives a sharper gradient or, in other words, a greater aiding field across the base region. For a high frequency transistor, this increases the $f_T$ and decreases the effective $r_b$, as hereinafter pointed out.

Figure 6:
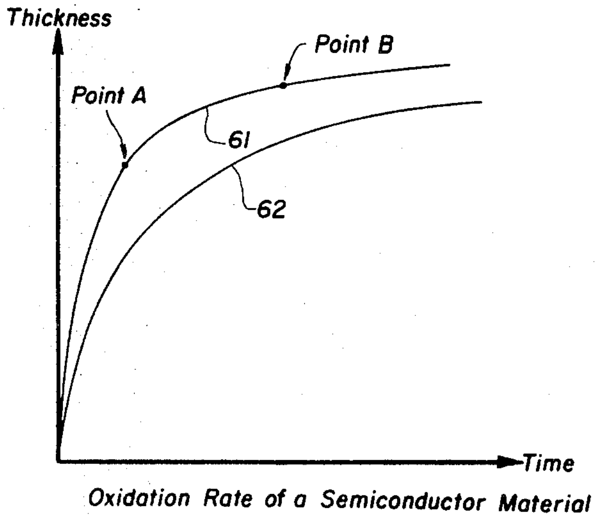
FIG. 6 is a graph showing the oxidation rate of a semiconductor material for two different sets of conditions encountered in semiconductor manufacture.

In FIG. 6, two curves 61 and 62 are shown giving the oxidation rate of a semiconductor material utilizing two given sets of conditions similar to that being practiced at the present time. As can be seen from both of these curves, the initial rate of growth of the oxide material is very rapid and thereafter decreases exponentially. Thus, if it is assumed that the anodically grown oxide or low-temperature glass is deposited to a depth represented by the point A on curve 61, it can be seen that the additional thermally grown oxide which will be grown during diffusion process represented by the time from point A to point B will be relatively small in comparison to the thickness of the anodically grown layer. Thus, it can be seen that by first depositing a layer of glass, the amount of silicon dioxide which will be subsequently grown during the diffusion process will have a greatly reduced thickness.

It should be appreciated that the wafer is not placed in the furnace to grow the oxide but that the oxide growth is a secondary effect from the diffusion process which is carried out in the furnace as, for example, the redistribution of the impurities in forming the emitter as hereinbefore described. The reason for the exponential decrease in rate of growth of the oxide layer is because the growth of the oxide layer is dependent upon diffusion of oxygen atoms through the oxide layer. Thus, starting with a finite thickness of oxide, the next additional increment of oxide will grow at a slow rate than the previous increment. This is an important factor because it is believed that the reason that a depletion region has previously been formed adjacent the surface of the device has been because the boron is being "gettered" or redistributed by the oxide growth. Thus, by greatly diminishing the growth of the thermally grown oxide during the diffusion process, it is possible to greatly reduce or practically eliminate the boron depletion effect which previously took place.

The two curves 61 and 62 are shown in FIG. 6 to point out that the oxidation rate will vary with a given diffusion process and depends primarily upon temperature. Thus, points A and B could as well be on curve 62 as 61.

Figure 7:
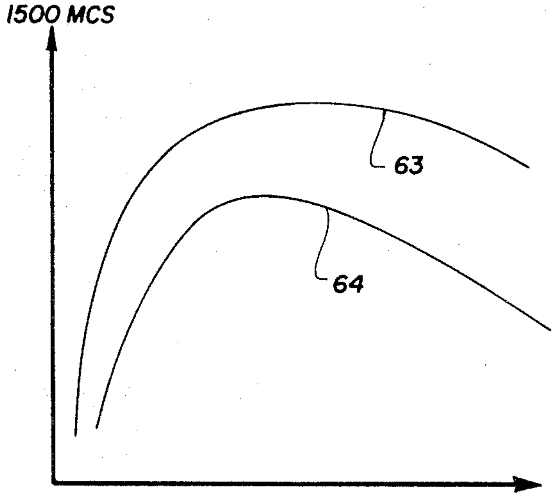
FIG. 7 is a graph showing the current gain-bandwidth frequency ($f_T$) of a semiconductor device manufactured in accordance with a conventional method and a semiconductor device manufactured in accordance with the present method.

In FIG. 7, two typical curves 63 and 64 are shown in which curve 63 is one obtained utilizing the present method, whereas curve 64 is one obtained utilizing a conventional process. The parameter $f_T$ is effected by increase in current. $f_T$ is defined as the frequency at which beta is equal to one in megacycles per second, whereas the current I is shown in milliamperes. In examining curves 63 and 64, it can be seen that the transistor made in accordance with the present invention represented by curve 63 has an $f$ which is greatly increased in value and which also has increased current-handling capabilities due to increased emitter ejection efficiency. Thus, in utilizing the method of the present invention, it can be seen that the curve in FIG. 7 not only moves up, but also out. This makes possible an increase in bandwidth frequency and in current-handling capabilities.

Figure 8:
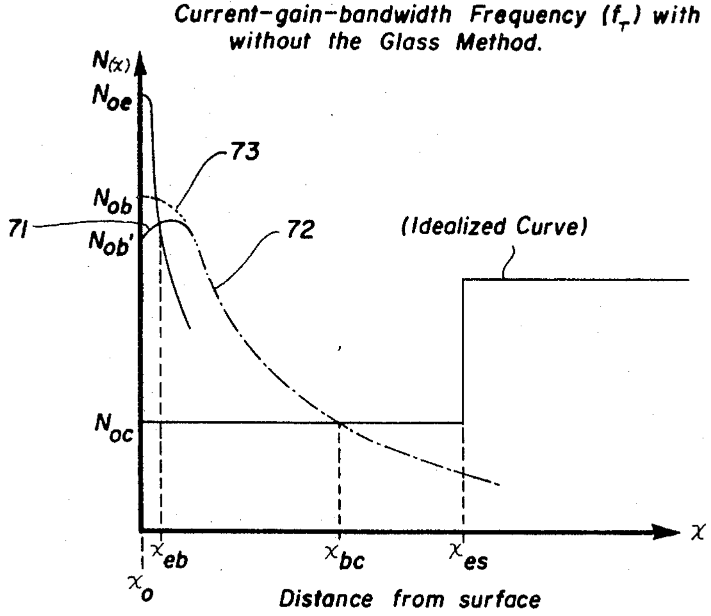
FIG. 8 is a graph showing the impurity distribution profile of an NPN epitaxial transistor.

In FIG. 8, there is shown an impurity distribution profile of an NPN transistor in which the solid curve 71 and the dot-dash curve 72 represent the profile obtained with conventional method, whereas dotted curve 73 and dot-dash curve 72 represents the profile obtained utilizing a method incorporating the present invention. Since the electric field is dependent upon the impurity profile as shown by the proportional slope of the curves in FIG. 8, it can be seen from curve 71 that the profile adds to the retarding field of the emitter-base potential whereas from curve 73, the profile tends to minimize the retarding potential and to aid the passage of minority carriers throughout the remainder of the base regions to thereby enhance the $f_T$ of the transistor. In the graph shown in FIG. 8, $x_0$ represents the semiconductor surface; $x_{eb}$ represents the emitter-base junction; $x_{bc}$ represents the base-collector junction; and $x_{es}$ represents the junction between the epitaxially grown layer and the substrate. $N_{ob}$ represents the impurity concentration of the base at the surface for a transistor constructed with conventional techniques, whereas $N_{ob}'$ represents the impurity concentration of the base at the surface of a transistor constructed in accordance with the present invention. The point $N_{oc}$ represents the impurity concentration of the collector and $N_{oe}$ represents the impurity concentration of the emitter at the surface.

The electric field is related to the distribution profile as shown by the simplified equation below.

$$\epsilon = \frac{kT}{q} \cdot \frac{1}{N_x} \cdot \frac{dN_x}{dx} \qquad (1)$$

where $\epsilon$ = electric field in volt/cm.

$\frac{kT}{q}$ = a constant in volts $\frac{1}{N_x}$ = inverse of a point on the distribution profile in cm.$^3$ $\frac{dN_x}{dx}$ = slope of the distribution profile in cm.$^{-4}$ and where $k$ = Boltzmann's constant T = temperature in degrees Kelvin $q$ = charge per electron $N_x$ = number of impurities in atoms per cubic centimeter It is believed that that parameter $f_T$ is greatly improved for semiconductor devices fabricated in accordance with the present method because of effects upon certain terms of a simplified equation for f set forth below.

$$\frac{1}{f_T} \approx \frac{\phi}{\alpha_0 K_\theta}\left(r_e C_{Te} + \frac{W^2}{2.43 D_{mb} \ln \frac{N_B}{N_{BC}}} + \frac{x_m}{2V_{sc}} + r_{sc} C_{Tc}\right) \qquad (2)$$

where $r_e C_{Te}$ = emitter transport factor $\frac{W^2}{2.43 D_{mb} \ln \frac{N'_B}{N_{BC}}}$ = base transport factor $\frac{x_m}{2V_{sc}}$ = surface recombination factor $r_{sc} C_{Tc}$ = collector transport factor and where $\Phi$ = portionality constant $\alpha_0$ = low frequency grounded base current gain $K_\theta$ = excess of phase shift factor $r_e$ = emitter series resistance $C_{Te}$ = emitter transition capacitance $W^2$ = base width squared; the base width is the effective width between depletion layers.

2.43 = constant width assuming exponential distribution of the base diffusion profile $D_{mb}$ = diffusion coefficient of the minority carriers in the base region $N'_B$ = number of impurities in the base region next to the emitter $N_{BC}$ = background impurity concentration—number of impurities in the base region next to the collector before emitter diffusion $x_m$ = depletion layer thickness $2V_{sc}$ = scattering-limited velocity $r_{sc}$ = collector series resistance $C_{Tc}$ = collector transition capacitance From the above equation (2), it can be seen that $f_T$ is directly related to the second term and is primarily determined by the second term. In particular, the second term is significant because it contains $N'_B/N_{BC}$ which defines the aiding field which is enhanced with the present method, and thus makes $f_T$ greater. The second term is also significant because it contains $D_{mb}$ which varies with the concentration of the impurities in the base, and thus also makes $f_T$ greater.

From the foregoing, it can be seen that it is desirable to utilize anodically grown silicon dioxide or low-temperature glass whenever a high concentration of boron is desired near the surface and beneath a layer of silicon dioxide. Thus, the method has a broad application and can be used for many types of devices as explained hereinbefore and in particular for NPN and PNP transistors. The use of the anodic oxide is desirable whenever boron impurities are being diffused into a semiconductor body and is also useful in subsequent diffusion steps where there is a region containing boron adjacent to a layer of silicon dioxide. The use of the anodic oxide makes it possible to retain or obtain the desired distribution of boron immediately beneath the surface and normally makes it possible to obtain a much higher concentration of boron than can be obtained with conventional processes. Thus, by way of example, the use of the anodic oxide is important in carrying out a diffusion step as, for example, shown in FIG. 1G. Alternatively, it is also useful in subsequent diffusion steps as, for example, the diffusion being carried out in the step shown in FIG. 2D in which the N-type region is being diffused into the P-type collector region 32 to prevent or inhibit the depletion of boron immediately adjacent the surface 38.

The use of anodic oxide or low-temperature glass in the fabrication of PNP-type devices has an additional advantage because it lowers the resistivity of the semiconductor surface immediately below the oxide which reduces the susceptibility of the P-type region to resistivity of the semiconductor surface immediately below the oxide which reduces the susceptibility of the P-type region to resistivity modulation by surface contaminants which is a frequent cause of parasitic channeling in semiconductor devices. The use of the anodically grown oxide or low-temperature glass also has additional advantages in that it lowers leakage and increases the breakdown voltage at a certain current level.

The use of anodically grown oxide is also advantageous in that the anodically grown oxide serves as a better mask in that it is freer of pinholes and imperfections. For this reason, to obtain the same masking effect, thinner layer of anodically grown silicon dioxide can be used than would be the case with thermally grown silicon dioxide.

It is apparent from the foregoing that there has been provided a new and improved semiconductor structure and a method for inhibiting the formation of a region which is depleted of boron adjacent the surface of the semiconductor device. Although the structure and method has been particularly described in conjunction with NPN and PNP transistors, it is readily apparent that the structure and method has application to MOS field effect transistors, diffused resistors, parasitic inversion channeling and monolithics, and P-type bottom plates or MOS capacitors. The method is one which can be readily integrated with conventional production techniques with relatively little, if any, increased expense.

Although the method has been described in conjunction with a shallow base NPN structure and a high breakdown PNP structure, the present method is also applicable to a wide variety of diffusion processes and passivation processes on many different types of semiconductor devices.

I claim:

1. In a semiconductor structure, a semiconductor body, at least one region having P-type impurities within the body, said region having a side exposed at a surface of said body and a layer of low-temperature glass substantially free of P-type impurities on said body and overlying said region, said layer of low-temperature glass being formed on said surface at a temperature of 400°—900° C., and a layer of glass, overlying said region, formed in situ on said surface simultaneously with diffusion of the P-type impurities in said region at a temperature of 1,000° to 1,300° C. and underneath said low-temperature layer, said region having a distribution of P-type impurities with a concentration at the surface of the region substantially at least equal to the concentration at any other depth in said region.

2. A structure as in claim 1 wherein said P-type impurity is boron.

3. A semiconductor structure as in claim 1 wherein said layer of low-temperature glass is anodically grown silicon dioxide.

4. A structure as in claim 1 wherein said last-named layer is formed essentially of silicon oxide.